(12) United States Patent
Fukami et al.

(10) Patent No.: US 7,960,988 B2
(45) Date of Patent: Jun. 14, 2011

(54) CONTACTOR FOR ELECTRICAL TEST, ELECTRICAL CONNECTING APPARATUS USING THE SAME, AND METHOD FOR MANUFACTURING CONTACTOR

(75) Inventors: Yoshiyuki Fukami, Ibaraki (JP);
Kazuya Numajiri, Ibaraki (JP); Osamu Arai, Tochigi (JP); Hideki Hirakawa, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 221 days.

(21) Appl. No.: 12/339,883

(22) Filed: Dec. 19, 2008

(65) Prior Publication Data
US 2009/0160473 A1    Jun. 25, 2009

(30) Foreign Application Priority Data

Dec. 21, 2007 (JP) ................................ 2007-329606

(51) Int. Cl.
*G01R 31/20* (2006.01)
*G01R 1/067* (2006.01)
*G01R 31/00* (2006.01)

(52) U.S. Cl. ................ 324/754.03; 324/755.07

(58) Field of Classification Search .................. None
See application file for complete search history.

(56) References Cited

U.S. PATENT DOCUMENTS 4,636,722 A * 1/1987 Ardezzone .................. 324/754
7,242,202 B2 * 7/2007 Groshong et al. ............ 324/754

FOREIGN PATENT DOCUMENTS

| EP | 1624308 A1 * | 2/2006 |
| JP | 2007128292 | 5/2007 |
| WO | 2007108110 | 9/2007 |

* cited by examiner

*Primary Examiner* — Roberto Velez
(74) *Attorney, Agent, or Firm* — Kevin D. Jablonski; Graybeal Jackson LLP (57) ABSTRACT

An electrical test contactor comprises a contactor main body including a plate-shaped attachment portion extending in the up-down direction, a plate-shaped arm portion extending from the lower end portion of the attachment portion at least to one side in the right-left direction, and a plate-shaped pedestal portion projecting downward from the tip end portion of the arm portion, a contact portion projecting downward from the lower end of the pedestal portion and having the lower end of the contact portion acting as a probe tip, and a resistor having a higher resistance value than the contactor main body and the contact portion and arranged at the contactor main body so as to heighten the resistance value of the contactor.

9 Claims, 10 Drawing Sheets

CONTACTOR FOR ELECTRICAL TEST, ELECTRICAL CONNECTING APPARATUS USING THE SAME, AND METHOD FOR MANUFACTURING CONTACTOR

PRIORITY CLAIM

The present application claims the benefit of Japanese Patent Application Serial No. 2007-329606, filed Dec. 21, 2007, which application is incorporated herein by reference in its entirety.

TECHNICAL FIELD

The present subject matter disclosed herein relates to a contactor for use in an electrical test of a flat-plate-shaped device under test such as a semiconductor integrated circuit, an electrical connecting apparatus using the same, and a method for manufacturing the contactor.

BACKGROUND

A flat-plate-shaped device under test such as a semiconductor integrated circuit undergoes an electrical test to determine whether or not it is manufactured in accordance with its specification. The electrical test of this kind is performed by using an electrical connecting apparatus, such as a probe card, a probe block, a probe unit, or the like, in which a plurality of probes or contactors to be thrust to respective electrodes of the device under test are arranged on a board such as a wiring board, a probe board, or the like. The electrical connecting apparatus of this kind is used to electrically connect the electrodes of the device under test to electrical circuits of a tester.

In one electrical connecting apparatus of this kind, there are a plurality of probes or contactors that are supported on the lower surface of a probe board in a cantilevered manner, and in which the probe board is arranged under a wiring board via an electrical connector to perform a power-supply electrical test of un-diced multiple integrated circuits formed on a semiconductor wafer at a time or in several batches as generally described in International Patent Publication No. WO 2007/108110.

However, in recent years, since there is an increasing demand for smaller and more high-density integrated circuits, wherein each recent integrated circuit, the pitch of pad electrodes has been reduced significantly, and the pad electrodes themselves have a tendency toward fine pitch. Also, for the purpose of increasing test efficiency, there is a demand for performing an electrical test of more integrated circuits at a time as in the case of the above electrical connecting apparatus.

In the electrical connecting apparatus for performing an electrical test of more integrated circuits in which the pad electrode pitch is reduced as in the above case, more contactors must be used, and thus the number of internal wires (especially wires as signal transmission paths) in the probe board and the wiring board electrically connecting a tester to the pad electrodes of the integrated circuits via the contactors is increased. Consequently, these internal wires are inevitably complicated and massed.

In the electrical connecting apparatus whose internal wires are complicated and massed as above, when defective integrated circuits having insulation failures, electrical short-circuit, etc., electrical signals in the internal wires for these defective integrated circuits have an adverse effect on signals to be input to the other good integrated circuits that may be tested simultaneously. As examples of such adverse effects, voltage reduction, waveform break, etc. of the signals to be input in the good integrated circuits may occur, in which case, a normal test is not performed.

To cope with the above situation, one solution adopts a technique of providing the wiring board or the probe board with a resistor electrically connected to each internal wire to electrically connect the tester to the integrated circuit via each internal wire and resistor as generally described in Japanese Patent Application No. 2007-128292, which is incorporated herein by reference.

However, with such a technique, it is difficult to form the resistor having a desired resistance value in the board. Also, the resistance value of each resistor and the internal wire can be measured only after the board to which the resistor is disposed is completed. Thus, in such a technique, it is impossible to determine whether or not the completed board is good at an early stage. The determination of whether or not the completed board is good is done by determining whether or not the resistance value of each resistor and each internal wire has a desired value.

For a defective board, work to repair the internal wire etc by scraping off a multi-layered wiring board comprised in the probe board or making a hole in the board is done. However, in this repair work, troublesome and precise work must be done since the internal wire is fine. As a result, such repair work can be done only by skilled workers. Providing the board with the resistors requires enormous amount of time and energy in the resistors providing work itself and prevents yield improvement of the board.

BRIEF SUMMARY OF THE INVENTION

According to an embodiment of the subject matter disclosed herein, a system and method may enable forming of resistors having desired resistance values easily to heighten yield of the resistors at the time of forming them.

An electrical test contactor may comprise a contactor main body including a plate-shaped attachment portion extending in the up-down direction, a plate-shaped arm portion extending from the lower end portion of the attachment portion at least to one side in the right-left direction, and a plate-shaped pedestal portion projecting downward from the tip end portion of the arm portion, a contact portion projecting downward from the lower end of the pedestal portion and having the lower end of the contact portion acting as a probe tip contacted to the device under test, and a resistor having a higher resistance value than the contactor main body and the contact portion and arranged at the contactor main body so as to heighten the resistance value of the contactor.

The resistor may be arranged at the contactor main body and electrically connect the contactor main body to the contact portion. The resistor may be arranged at least at the pedestal portion and electrically connect the pedestal portion to the contact portion.

The contact portion and a part of the contactor main body may be made of a same metal, and the metal may comprise a first portion located at the pedestal portion and acting as a part of the pedestal portion and a second portion projecting downward from the lower end of the pedestal portion and acting as the contact portion. The first portion may be electrically connected at its part to the other part of the pedestal portion except at least the first portion. The contactor main body, except at least the first portion, may be made of a first metal material having higher resiliency than the metal, and the metal may be made of a second metal material having higher hardness than the first metal material. At least the first portion may be exposed at its part to one side surface of the pedestal portion in the thickness direction. The resistor may be formed by at least one selected from a group consisting of an electroplating technique, a sputtering technique, and a deposition technique.

The electrical test contactor according to an embodiment may further comprise an electrical insulating layer arranged at least between the pedestal portion and the resistor so as to allow a part of the resistor to be electrically connected at least to the remaining portion of the pedestal portion except the first portion of the metal. An electrical connecting apparatus may comprise a plate-shaped or sheet-like board, and a plurality of the aforementioned electrical test contactors supported in a cantilevered manner on the lower surface of the board.

A method for manufacturing a contactor according to an embodiment may include forming an electrical test contactor having a contactor main body and a contact portion projecting from the contactor main body and having the tip end acting as a probe tip contacted to the device under test. Such a manufacturing method may comprise the following steps:

A first step of forming on the upper surface of a plate-shaped base member a resistor layer made of a highly-resistive conductive material having a higher resistance value than the contactor main body and the contact portion and taking the form of a resistor being as a part of a pedestal portion of the contactor.

A second step of forming on the base member and the resistor layer a metal layer made of a highly-hard conductive material having higher hardness than the remaining portion of the pedestal portion and taking the form of another part of the pedestal portion and the contact portion.

A third step of forming on the resistor layer and the metal layer a highly-resilient conductive layer made of a highly-resilient conductive material having higher resiliency than the metal layer and taking the form of the remaining portion of the contactor main body.

Another method for manufacturing a contactor according to an embodiment of the subject matter disclosed herein may include an electrical test contactor having a contactor main body and a contact portion projecting from the contactor main body and having the tip end as a probe tip. Such a manufacturing method may comprise the following steps:

A first step of forming on the upper surface of a plate-shaped base member a resistor layer made of a highly-resistive conductive material having a higher resistance value than the contactor main body and the contact portion and taking the form of a resistor being as a part of a pedestal portion of the contactor.

A second step of forming on the base member and the resistor layer a metal layer made of a highly-hard conductive material having higher hardness than the remaining portion of the pedestal portion and taking the form of another part of the pedestal portion and the contact portion.

A third step of forming on the base member, a part of the metal layer, and the resistor layer an electrical insulating layer made of an electrical insulating material and taking the form of a portion of the metal layer located in the pedestal portion and a part of the resistor layer.

A fourth step of forming on the resistor layer and the metal layer a highly-resilient conductive layer made of a highly-resilient conductive material having higher resiliency than the metal layer and taking the form of the remaining portion of the contactor main body.

Still a further method for manufacturing a contactor according to one embodiment may include forming an electrical test contactor having a contactor main body and a contact portion projecting from the contactor main body and having the tip end as a probe tip. Such a manufacturing method comprises the following steps:

A first step of forming on the upper surface of a plate-shaped base member a resistor layer made of a highly-resistive conductive material having a higher resistance value than the contactor main body and the contact portion and taking the form of a resistor being as a part of a pedestal portion of the contactor.

A second step of forming on the base member and the resistor layer a metal layer made of a highly-hard conductive material having higher hardness than the remaining portion of the pedestal portion and taking the form of another part of the pedestal portion and the contact portion.

A third step of forming on a part of the metal layer and the resistor layer an electrical insulating layer made of an electrical insulating material and taking the form of a portion of the metal layer located in the pedestal portion and a part of the resistor layer.

A fourth step of forming on a part of the resistor layer and the electrical insulating layer a conductive layer made of a conductive material and taking the form of a portion of the metal layer located in the pedestal portion and a part of the resistor layer.

A fifth step of forming on the conductive layer a highly-resilient conductive layer made of a highly-resilient conductive material having higher resiliency than the metal layer and taking the form of the remaining portion of the contactor main body.

According to the various embodiments briefly described above, a contactor includes a resistor having a higher resistance value than a pedestal portion and a contact portion and arranged at a contactor main body so as to heighten the resistance value of the contactor. Accordingly, since it is possible to determine whether or not the contactor is good by measuring the resistance value of the contactor itself, a contactor having a desired resistance value can be selected for use in an electrical connecting apparatus. Also, internal wires of a board can be simplified since there is no need to arrange a resistor in the board, and the yield of the board to be manufactured is improved since there is no need to repair the board whose resistance value is not good.

DETAILED DESCRIPTION

Figure 1:
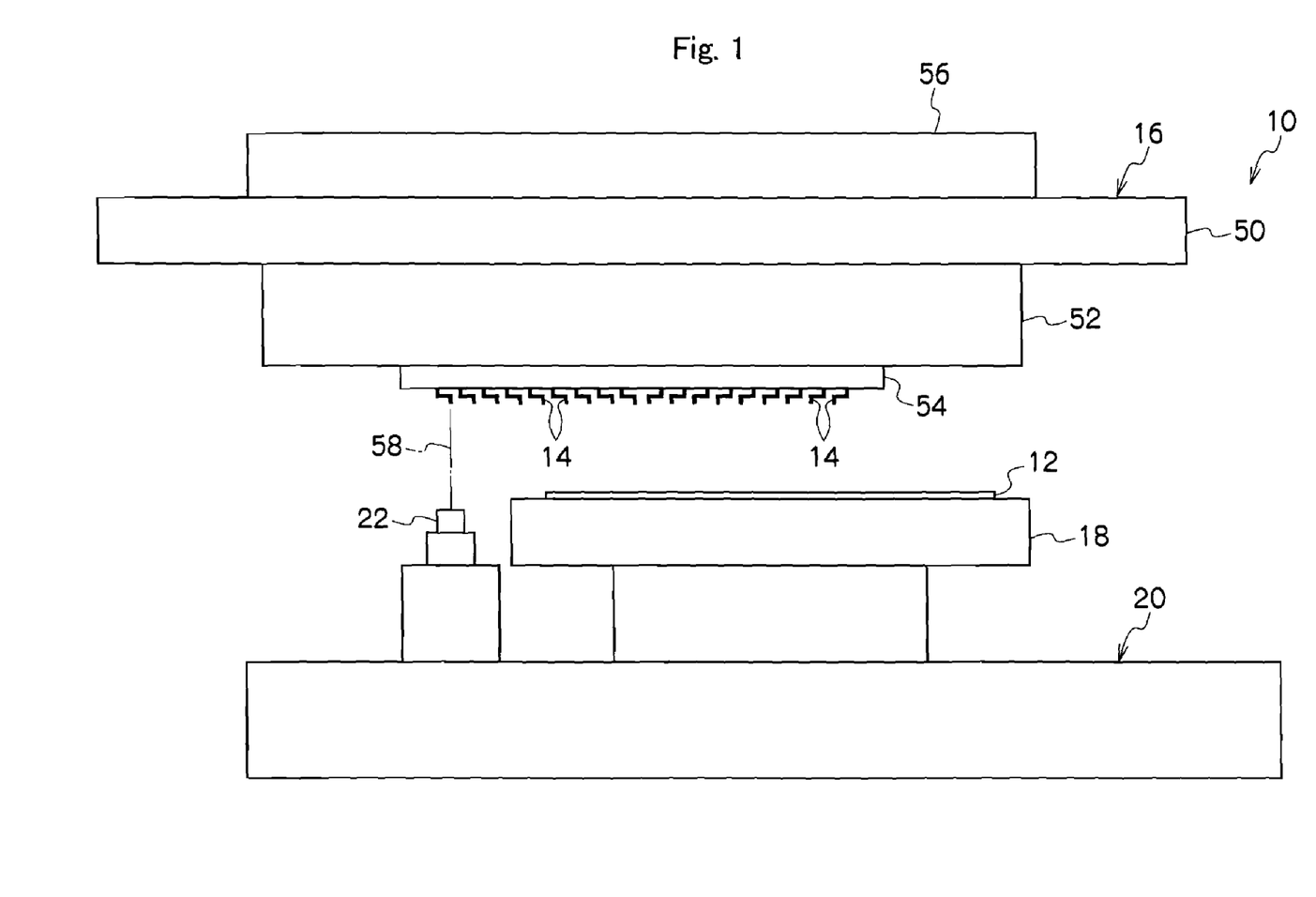
FIG. 1 is a front view showing an electrical test apparatus using a contactor according to an embodiment of the subject matter disclosed herein.

Throughout the detailed description, and in particular with respect to FIG. 1, the direction in which the electrical connecting apparatus side is the upper side, and in which the test stage side is the lower side is referred to as an up-down direction, the right-left direction perpendicular to this up-down direction is referred to as a right-left direction, and the direction perpendicular to the drawing sheet is referred to as a front-back direction.

However, the up-down direction differs depending on the posture of a device under test against a tester at the time of a test. Accordingly, the up-down direction may be determined to be any one direction of an up-down direction, a reverse direction, a horizontal direction, and an inclined direction inclined to the horizontal plane in accordance with an actual testing apparatus.

Referring to FIG. 1, an electrical test apparatus 10 is arranged to a tester (not shown) for testing a circular-plate-shaped semiconductor wafer having a plurality of integrated circuits as a device under test 12. The tester performs an electrical performance test for the plural non-cutting integrated circuits formed on the device under test (wafer) 12 at a time or in several batches. Each integrated circuit has a plurality of electrodes such as pad electrodes on the upper surface.

The electrical test apparatus 10 may include a probe card or an electrical connecting apparatus 16 having a plurality of plate-shaped contactors 14, a chuck top 18 on which integrated circuits 21 are arranged, a test stage 20 that lets the chuck top 18 move in a three-dimensional manner at least in the front-back direction, the right-left direction, and the up-down direction, and an area sensor 22 such as a CCD camera arranged on the test stage 20 so as to capture an image of at least one of electrical test contactors 14.

Referring to FIGS. 2 to 6, each contactor 14 may include an attachment portion 24 extending in the up-down direction, an arm portion 26 extending from the lower end portion of the attachment portion 24 to one side in the right-left direction, a plate-shaped pedestal portion 28 projecting downward from the tip end portion of the arm portion 26, and a contact portion 30 projecting downward from the lower end of the pedestal portion 28. The attachment portion 24, the arm portion 26, and the pedestal portion 28 act as a contactor main body in the present embodiment.

The aforementioned contactor main body may be formed integrally in a plate shape having an identical thickness dimension. The large part of the contactor main body except a part of the pedestal portion 28 described later is formed by deposition of a highly-resilient conductive metal material such as a nickel-phosphor alloy (Ni—P), a nickel-tungsten alloy (Ni—W), rhodium (Rh), phosphor bronze (Cu—Sn—P), nickel (Ni), a palladium-cobalt alloy (Pd—Co), a palladium-nickel-cobalt alloy (Pd—Ni—Co), or the like.

The aforementioned part of the pedestal portion 28 may include a first portion 34a of a metal 34, a resistor 36, an electrical insulating layer 38, and a conductive metal layer 40 described later with reference to FIG. 6. Since the remaining part except the part of the pedestal portion 28 may be made of the highly-resilient conductive metal material, it can be elastically deformed and acts as a main portion of the pedestal portion 28 or a pedestal main portion 28a.

The contact portion 30 may be made of a conductive metal material whose hardness is higher than that of the metal material forming the attachment portion 24 and so on. In the example shown in the figures, the lower end surface of the contact portion 30 may be a flat probe tip 32 perpendicular to a virtual axis 31 (refer to FIG. 3) extending in the up-down direction so as to be thrust to the electrode of the device under test 12.

Figure 6:
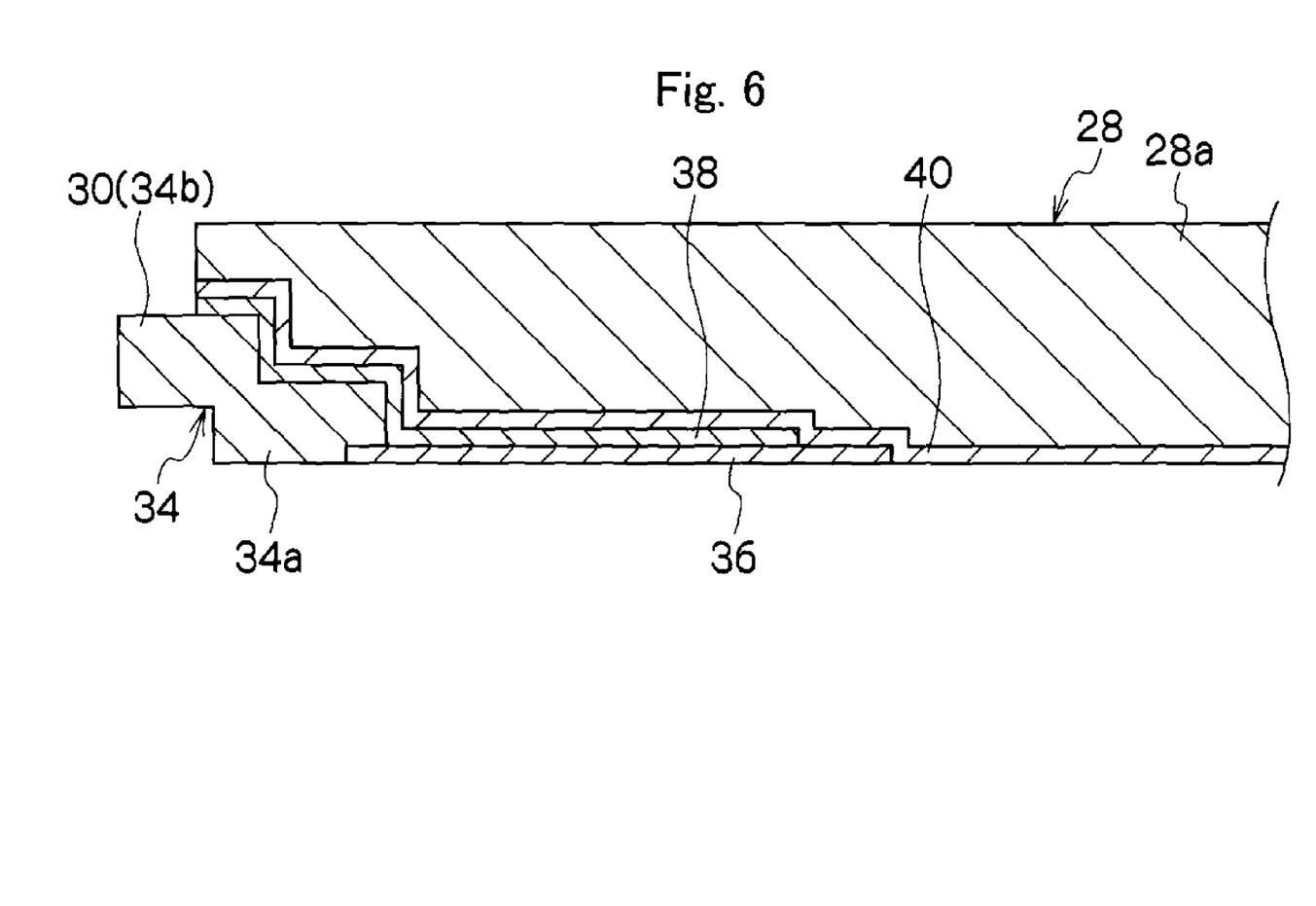
FIG. 6 is an enlarged cross-sectional view obtained along the line 6-6 in FIG. 5.

As shown in FIG. 6, the aforementioned metal 34 may be formed to be shared by the contact portion 30 and at least a part of the pedestal main portion 28a. The metal 34 is formed by deposition of a conductive metal material, such as rhodium (Rh) or tungsten (W), having higher hardness than the conductive metal material forming the pedestal main portion 28a.

The metal 34 may be formed in a crank shape by the first portion 34a located at the pedestal portion 28 and acting as a member of a part of the pedestal portion 28 and a second portion 34b projecting downward from the lower end of the pedestal portion 28 and acting as the contact portion 30.

Referring to FIG. 6, the aforementioned resistor 36 of each contactor 14 may be formed in a sheet shape by a conductive metal material having a higher resistance value than the pedestal portion 28 and the contactor 30. The resistor 36 may have its one surface exposed to one surface of the pedestal portion 28 which electrically connects the first portion 34a (and thus the contactor 30) of the metal 34 to the pedestal main portion 28a.

The resistor 36 may be made of a conductive metal material, such as e.g., a chromium-palladium alloy (Cr—Pd), chromium (Cr), a titanium-palladium alloy (Ti—Pd), titanium (Ti), tantalum oxide (TaO), tantalum nitride ($Ta_2N$), or a nickel-chromium alloy (Ni—Cr), having a higher resistance value than the metal material forming the pedestal main portion 28a or the metal material forming the metal 34.

The resistor 36 may be formed integrally with the metal 34 and the after-mentioned electrical insulating layer 38 and the metal layer 40 by deposition of the above conductive metal material. The aforementioned electrical insulating layer 38 and conductive metal layer 40 of each contactor 14 are arranged between the resistor 36 and the pedestal portion 28 to be piled on each other as shown in FIG. 6.

The electrical insulating layer 38 may be made of electrical insulating resin such as polyimide. The electrical insulating layer 38 may be formed integrally with the first portion 34a-side surface of the metal 34 and a pedestal main portion 28a-side surface of the resistor 36 so that the resistor 36 electrically connects at its part at least the first portion 34a of the metal 34 to the pedestal main portion 28a.

The electrical insulating layer 38 may include an upper end portion of the resistor 36 exposed to the metal layer 40. Such an exposed part of the resistor 36 may be electrically connected to the pedestal main portion 28a via the metal layer 40, and the other part of the resistor 36 may be electrically insulated from the pedestal main portion 28a.

The metal layer 40 may be formed by deposition of a conductive metal material, such as a chromium-palladium alloy (Cr—Pd) or a titanium-palladium alloy (Ti—Pd), having comparable conductivity to the pedestal main portion 28a.

A part of the metal layer 40 may cover a part of the electrical insulating layer 38 on the pedestal main portion 28a side and the exposed part of the resistor 36 exposed by the electrical insulating layer 38. The remaining part of the metal layer 40 is exposed at least to one surface of the main portion 28a.

The resistor 36, the electrical insulating layer 38, and the metal layer 40 may be integrally coupled in a state of being piled on one another and may be coupled integrally with the pedestal main portion 28a at the metal layer 40. Accordingly, since the coupling force between the contact portion 30 and the pedestal main portion 28a is strong in cooperation with the fact that the metal 34 is coupled at its first portion 34a integrally with the other part of the pedestal portion 28, the contact portion 30 may be prevented from dropping from the pedestal portion 28 reliably.

Figure 2:
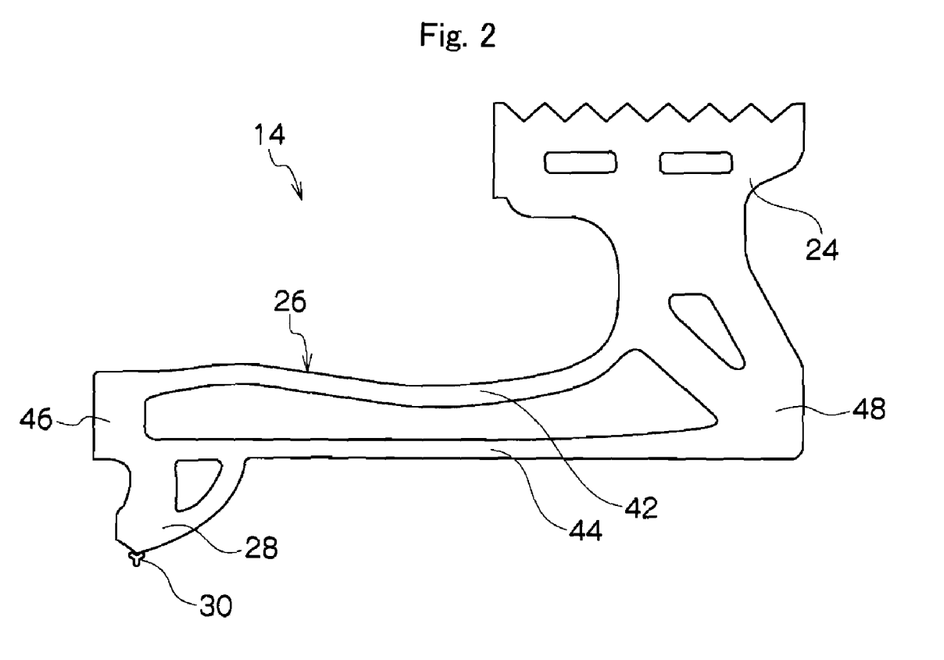
FIG. 2 is a front view showing a contactor according to an embodiment of the subject matter disclosed herein.
Figure 3:
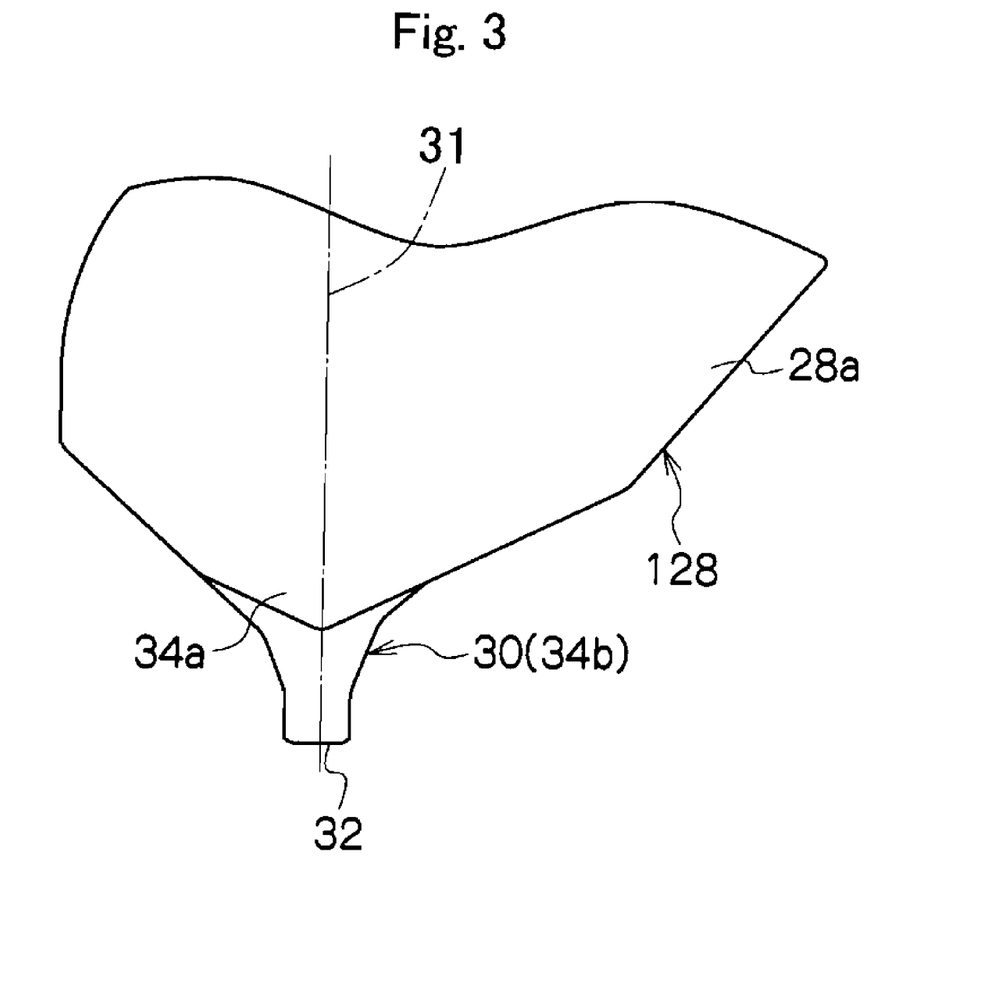
FIG. 3 is an enlarged front view showing the proximity of a contact portion of the contactor shown in FIG. 2.
Figure 4:
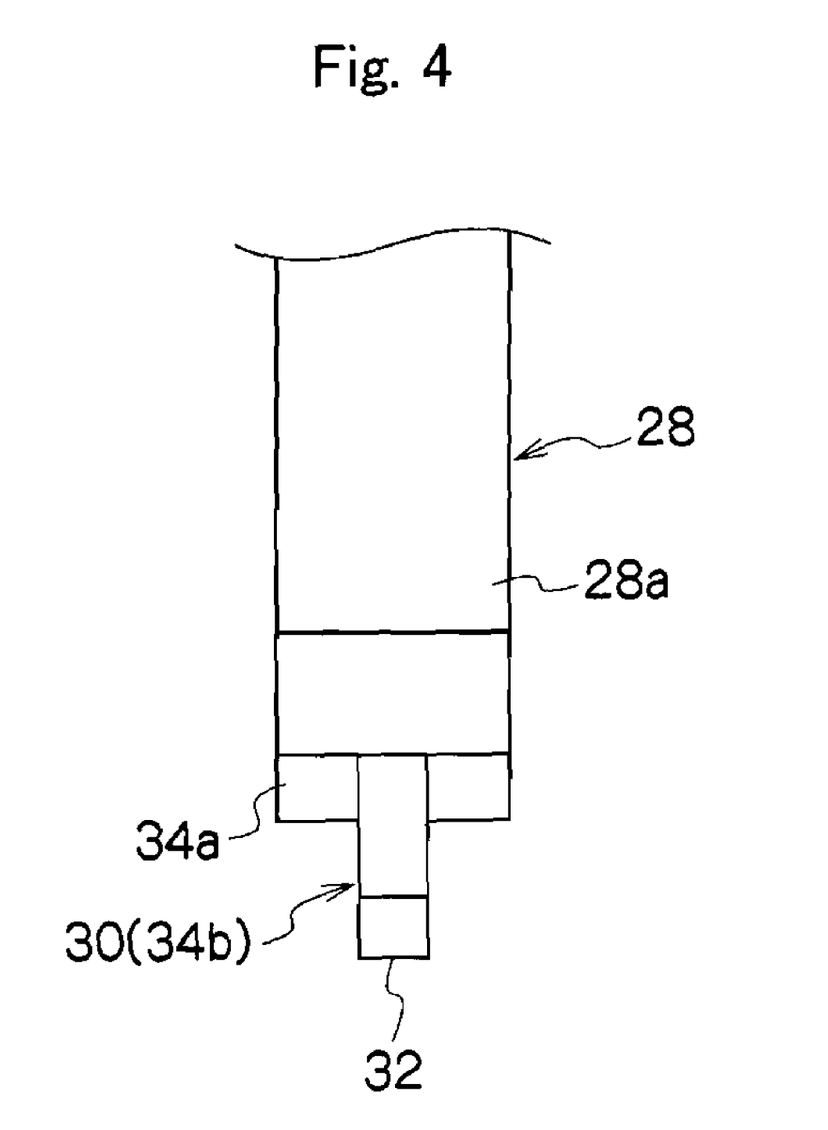
FIG. 4 is a left side view of FIG. 3.
Figure 5:
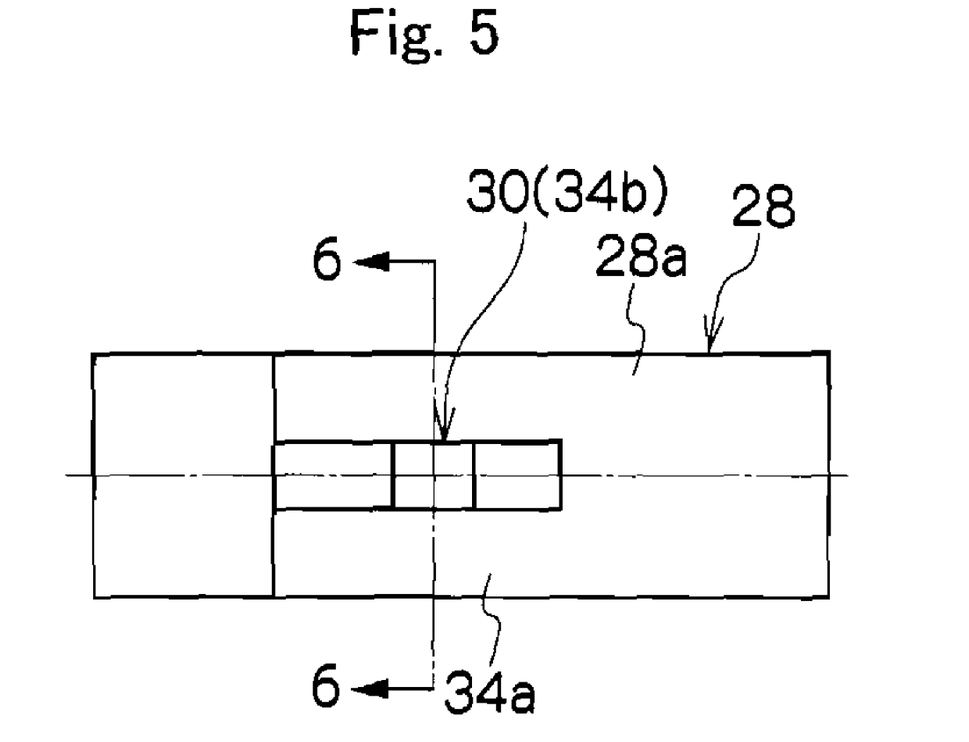
FIG. 5 is a bottom view of FIG. 3.

In the example shown in FIG. 2, the arm portion 26 comprises two arm regions 42, 44 extending in the right-left direction to be spaced in the up-down direction and two joining regions 46, 48 joining the both arm regions 42, 44 respectively at their tip end portions and rear end portions.

Referring to FIGS. 2 to 6 again, the second portion 34*b* of the metal 34, that is, the contact portion 30, may be formed in a truncated pyramidal shape when seen in the front-back direction. Thus, each surface of the contact portion 30 in the right-left direction may be inclined to the virtual axis 31 extending in the up-down direction.

The probe tip 32 may be a lower surface of a columnar tip end portion of the second portion 34*b*. However, the probe tip 32 may be a surface inclined to the virtual axis 31 extending in the up-down direction or a sharp probe tip such as a tip end of a pyramidal shape or a conical shape.

The electrical insulating layer 38 may enlarge the coupling area between the resistor 36 and the conductive metal layer 40 and may increase the coupling force of both portions. The conductive metal layer 40 may enlarge the coupling area between the electrical insulating layer 38 and the pedestal main portion 28*a* and may increase the coupling force of both portions. Thus, even when the resistor 36 is enlarged, the coupling force between the resistor 36 and the pedestal main portion 28*a* is high although a desired resistance value can be obtained.

Each contactor 14 may be attached in a cantilevered manner at the upper surface of the attachment portion 24 to a flat conductive portion (e.g., a connection land) formed on the lower surface of the electrical connecting apparatus 16 by a conductive bonding material such as solder.

In the above contactor 14, the dimensions of the resistor 36 may be as follows, for example.

The length dimension (dimension in the right-left direction in FIG. 6)=500 µm.

The width dimension (dimension in the right-left direction or the direction perpendicular to the drawing sheet in FIG. 6)=10 µm.

The thickness dimension (dimension in up-down direction in FIG. 6)=0.1 µm.

For example, the resistance value of the resistor 36 at the time of manufacturing the resistor 36 by sputtering with use of a chromium-palladium alloy whose resistivity is 45 µΩ·cm or a nickel-chromium alloy whose resistivity is 107 µΩ·cm can be derived from the following Equation (1):

$$R = \rho \cdot S/L \quad (1)$$

where ρ is resistivity, S is a cross-sectional area (aforementioned width dimension×thickness dimension of the resistor 36), and L is the aforementioned length dimension.

According to Equation (1), the resistance value of the resistor 36 made of the chromium-palladium alloy whose resistivity is 45 µΩ·cm is 225Ω, and the resistance value of the resistor 36 made of the nickel-chromium alloy whose resistivity is 107 µΩ·cm is 535Ω.

The resistance value of the resistor 36 is preferably about 200 to 500Ω. This is based on the following reasons.

In an actual electrical test, electrical signals generated in the tester may be transmitted to internal wires of a wiring board 50 of the electrical connecting apparatus 16 from the tester via another wires and may be further branched in the inside of a probe board 54 via internal wires of a ceramic board 52 to finally reach the device under test 12.

That is, the respective electrical signals from the tester are branched and input to a plurality of the integrated circuits In a case where there exist defective integrated circuits, such as integrated circuits having insulation failures in the input electrodes, short-circuit in the silicon substrate, etc. at the time of the test, the other branched electrical signals are affected, and the electrical signals to be given to good integrated circuits are affected, and thus the good integrated circuits cannot be tested under normal conditions.

To restrict the above problems, resistance having as a large value as possible at the branched wires may be desirable, but the larger the R value of the time constant τ represented in Equation (2), the larger the time constant becomes, and the waveforms of the input signals break. Accordingly, the above value is preferable as the resistance value of the resistor 36.

$$\tau = C \cdot R \quad (2)$$

where C is capacitance, and R is resistance.

As shown in FIG. 1, the electrical connecting apparatus 16 may include the wiring board 50 made of an electrical insulating material such as glass-containing epoxy resin, the ceramic board 52 attached to the lower surface of the wiring board 50, the probe board 54 attached to the lower surface of the ceramic board 52, and a reinforcing plate 56 attached to the upper surface of the wiring board 50.

The probe board 54 may have flat conductive portions such as connection lands on the lower surface. Each contactor 14 may be attached on the conductive portion in a cantilevered manner at the upper end portion of the attachment portion 24 by a conductive bonding material such as solder in a state where the arm portion 26 extends in the right-left direction so that the probe tip 32 is opposed to a corresponding electrode of the device under test 12 received on the chuck top 18 under the state where this is incorporated in the electrical connecting apparatus 16.

The chuck top 18 may vacuum-absorb and unmovably maintain the integrated circuits 12 and release the adsorption. The test stage 20 may have a three-dimensional moving mechanism that moves the chuck top 18 in the three directions of front-back, right-left, and up-down directions and may have a θ moving mechanism that angularly rotates the chuck top 18 around an axis extending in the up-down direction.

As shown in FIG. 1, the area sensor 22 may focus a beam 58 and direct it toward the probe tip 32 of a specific contactor 14 to illuminate the probe tip 32 and its proximity, receive a reflected light from the probe tip 32 and its proximity, and convert it into an electrical signal. The output signal of the area sensor 22 may be supplied to an image processing apparatus determining the coordinate position of the specific contactor 14, especially the probe tip 32.

In the electrical test apparatus 10, the beam 58 irradiated to the specific contactor 14 from the lower side may be reflected on the probe tip 32 of the contact portion 30 and the lower surface of the pedestal portion 28. The reflected light may be converted at the area sensor 22 into an electrical signal in accordance with the amount of the reflected light. The converted electrical signal may be used for determination of the coordinate positions of the electrical connecting apparatus 16 against the tester in the electrical circuits of the tester.

The exposed part of the resistor 36 to the metal layer 40 has a great effect on the total resistance value of the contactor 14. Each contactor 14 may be manufactured so that the thickness dimension of the resistor 36 and the area of the exposed part of the resistor 36 are values within desired ranges, for example, in order to render its total resistance value a value within a desired range. Such a contactor 14 can be manufactured with use of a photolithographic technique, a deposition technique of metal materials, etc., as described later.

The total resistance value of each contactor 14 may be measured before each contactor 14 is attached to the probe board 54, and it is determined whether or not each contactor 14 is good based on whether or not the measured resistance value is within a desired range. In attachment of the contactors 14 to the probe board 54, good contactors 14 having resistance values within the desired range may be selected, and the selected contactors 14 can be used in the electrical connecting apparatus 16.

Each contactor 14 may be electrically connected to a connection portion (not shown) such as a tester land or a connector provided on the upper surface of the wiring board 50 via the internal wires of the probe board 54, the ceramic board 52, and the wiring board 50 under the state where it is incorporated in the electrical connecting apparatus 16. Each connection portion may be connected to the electrical circuits of the tester under the state where the electrical connecting apparatus 16 is attached to the tester.

Under the state where the electrical connecting apparatus 16 is attached to the tester, each contactor 14 may be thrust at its probe tip 32 to the electrode of the device under test 12. As a result, each contactor 14 may be bent at the arm portion 26 by elasticity. In such a state, an electrical signal from the tester is input in the device under test 12 via a predetermined contactor 14, and an electrical signal from the device under test 12 may be taken out to the tester via the predetermined contactor 14.

According to each contactor 14, the internal wires of the board can be simplified since there is no need to arrange a resistor in the board, and the yield of the board to be manufactured may be improved since there is no need to repair the board whose resistance value is not good.

Referring to FIGS. 7 to 10, one example of a method for manufacturing the contactor 14 having a structure shown in FIGS. 2 to 6 is explained. FIGS. 7 to 10 show cross-sectional states obtained along the line 6-6 in FIG. 5 in the same manner as in FIG. 6.

First, as shown in FIG. 7 (A), a plate-shaped substrate 60 made of stainless steel or silicon may be prepared, and a nickel layer 62 is formed on the upper surface of the substrate 60 by a deposition technique such as electroplating, sputtering, deposition, or the like, preferably by sputtering. Next, as shown in FIG. 7 (B), a copper layer 64 may be formed on the upper surface of the nickel layer 62 by a deposition technique such as electroplating, sputtering, deposition, or the like, preferably by sputtering. The nickel layer 62 and the copper layer 64 may be used to make it easy to remove (detach) the manufactured contactor from the substrate 60 after the contactor has been manufactured on these.

Figure 7A:
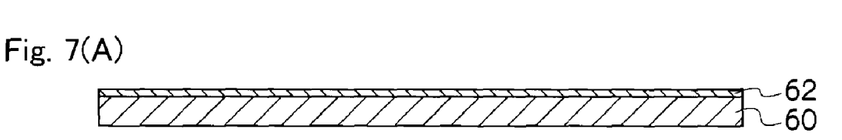
FIG. 7 is a step diagram showing one embodiment of a method for manufacturing the contactor shown in FIGS. 2 to 6.
Figure 7B:
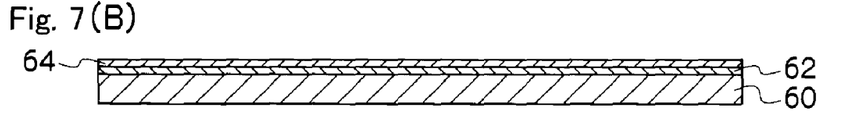
Figure 7C:
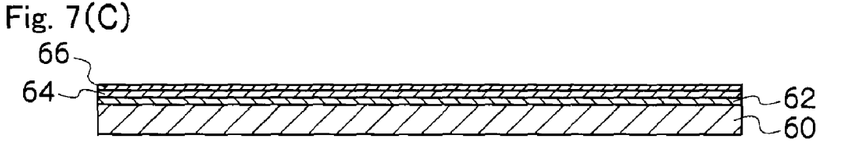

Next, as shown in FIG. 7(C), a resistor layer 66 using the aforementioned metal material may be formed on the upper surface of the copper layer 64 by a deposition technique such as electroplating, sputtering, deposition, or the like, preferably by sputtering.

Figure 7D:
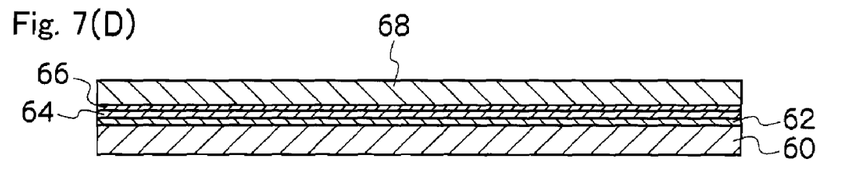

Next, as shown in FIG. 7(D), a photoresist layer 68 may be formed on the upper surface of the resistor layer 66 by application.

Figure 7E:
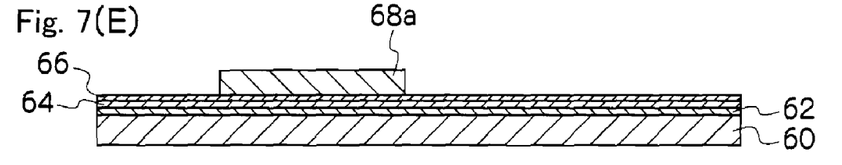

Next, as shown in FIG. 7(E), after the photoresist layer 68 is exposed under the state where a part of it is masked and is developed, the photoresist layer 68 may be etched. As a result, a protrusion of the photoresist layer 68 is formed. This protrusion may be a remaining portion 68a in the photoresist layer 68 after the other part has been removed in the development processing and is formed in a flat surface shape taking the form of the aforementioned resistor 36.

Figures 7F, 7G:
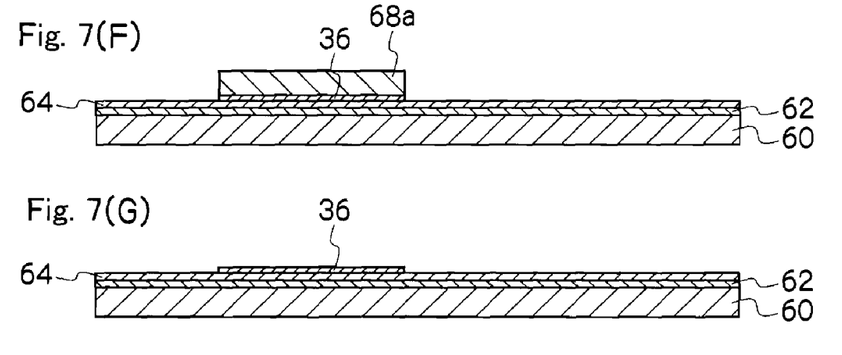

Next, as shown in FIG. 7(F), the resistor layer 66 may be etched, and the resistor 36 may be formed on the copper layer 64. The resistor 36 is formed by removing, by the etching processing, a part of the resistor layer 66 except a part covered with the remaining portion 68a of the photoresist layer 68 after the development processing. That is, the resistor 36 corresponds to a remaining portion of the resistor layer 66 after the development processing.

Next, as shown in FIG. 7(G), the remaining portion 68a of the photoresist layer 68 may be removed in a state where the resistor 36 is left.

Figure 8A:
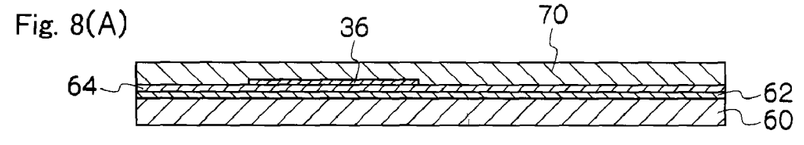
FIG. 8 explains the steps following FIG. 7.

Next, as shown in FIG. 8(A), a photoresist layer 70 may be formed on the upper surfaces of the copper layer 64 and the resistor 36 by application.

Figure 8B:
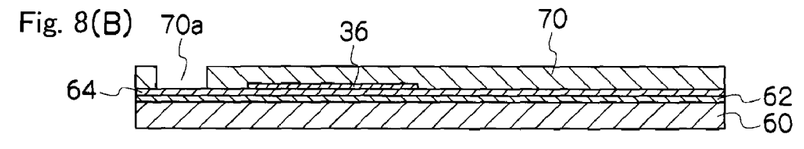

Next, as shown in FIG. 8(B), the photoresist layer 70 may be exposed under the state where a part of it is masked and is developed. By such a photolithographic technique, a recess 70a is formed in the photoresist layer 70.

Figure 8C:
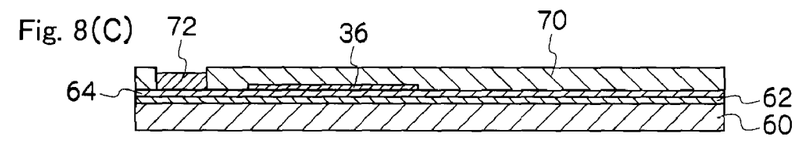

Next, as shown in FIG. 8(C), a metal material such as copper may be deposited at least in the recess 70a by a deposition technique such as electroplating, sputtering, deposition, or the like, preferably by electroplating In this manner, a sacrificial layer 72 may be formed in the recess 70a.

Figure 8D:
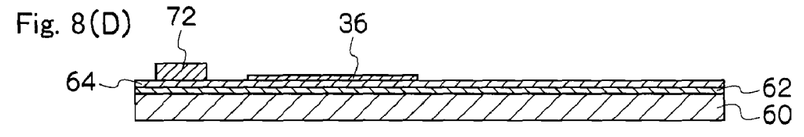

Next, the photoresist layer 70 may be removed. As a result, as shown in FIG. 8(D), the copper layer 64, the resistor 36, and the sacrificial layer 72 may be exposed.

Figure 8E:
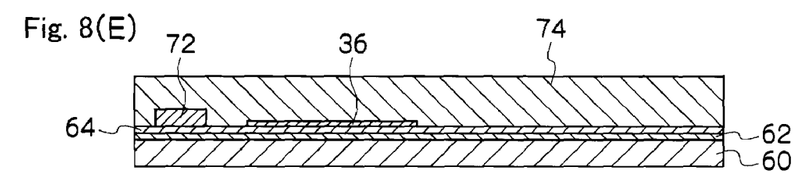

Next, as shown in FIG. 8(E), a photoresist layer 74 may be formed on the upper surfaces of the copper layer 64, the resistor 36, and the sacrificial layer 72 by application.

Figure 8F:
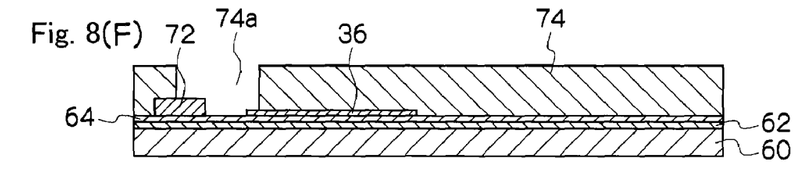

Next, the photoresist layer 74 may be exposed under the state where a part of it is masked and is developed. By such a photolithographic technique, as shown in FIG. 8(F), a recess 74a formed in a flat surface shape taking the form of the aforementioned metal 34 may be formed in the photoresist layer 74, and parts of the sides of the resistor 36 and the sacrificial layer 72 opposed to each other are exposed in the recess 74a.

Figure 9A:
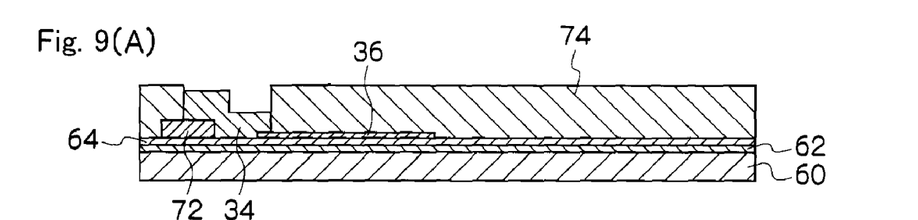
FIG. 9 explains the steps following FIG. 8.

Next, as shown in FIG. 9(A), a conductive metal material having high hardness such as rhodium may be deposited at least in the recess 74a by a deposition technique such as electroplating, sputtering, deposition, or the like, preferably by electroplating. In this manner, the metal 34 coupled integrally at least with the resistor 36 may be formed in the recess 74a.

Figure 9B:
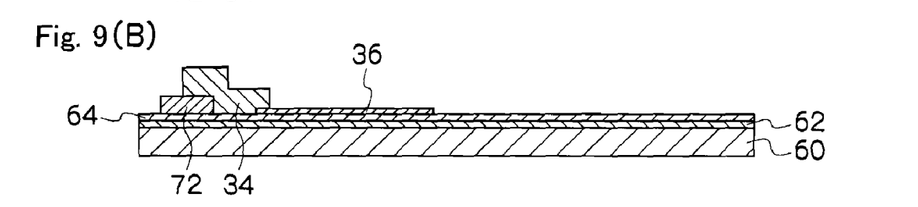

Next, the photoresist layer 74 may be removed As a result, as shown in FIG. 9(B), the copper layer 64, the resistor 36, the metal 34, and the sacrificial layer 72 may be exposed.

Figure 9C:
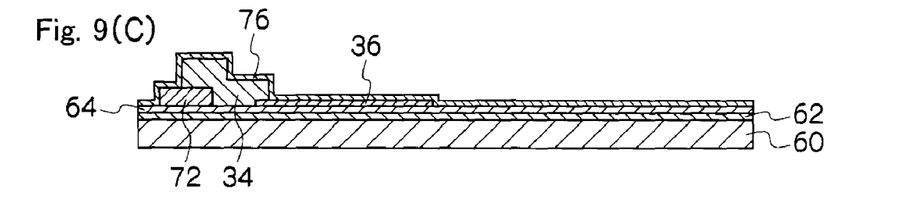

Next, as shown in FIG. 9(C), an electrical insulating material 76 such as polyimide resin may be applied on the exposed upper surfaces of the copper layer 64, the resistor 36, the metal 34, and the sacrificial layer 72.

Next, a photoresist (not shown) may be applied on the upper surface of the electrical insulating material 76, and the photoresist undergoes processing by a photolithographic technique. As a result, the photoresist may be removed over a range except a part formed in a flat surface shape taking the form of the aforementioned electrical insulating layer 38. Accordingly, the photoresist may be exposed upward, remaining the part formed in a flat surface shape taking the form of the electrical insulating layer 38.

Figure 9D:
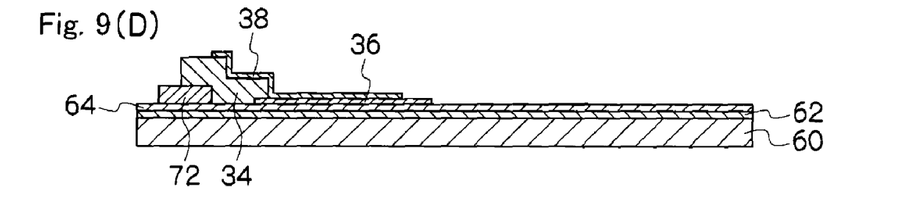

Next, under the above state, the electrical insulating material 76 may be etched. As a result, as shown in FIG. 9(D), the exposed part of the electrical insulating material 76 may be removed, and the electrical insulating layer 38 integral with the resistor 36 remains on the upper surface of the resistor 36, and also a part of the resistor 36, a part of the sacrificial layer 72, and a remaining portion of the copper layer 64 may be exposed upward.

Figure 9E:
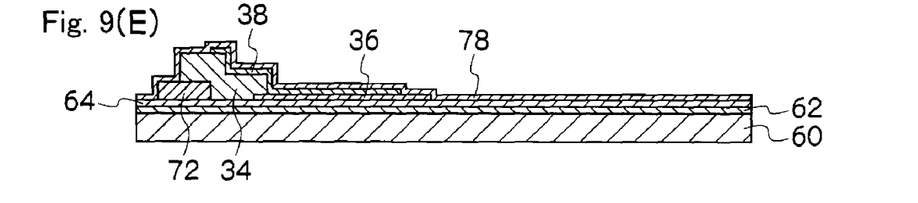

Next, as shown in FIG. 9(E), a conductive metal material 78 having comparable conductivity to the pedestal main portion 28a may be deposited on the exposed parts of the resistor 36, the sacrificial layer 72, and the copper layer 64 by a deposition technique such as electroplating, sputtering, deposition, or the like, preferably by sputtering.

Figure 9F:
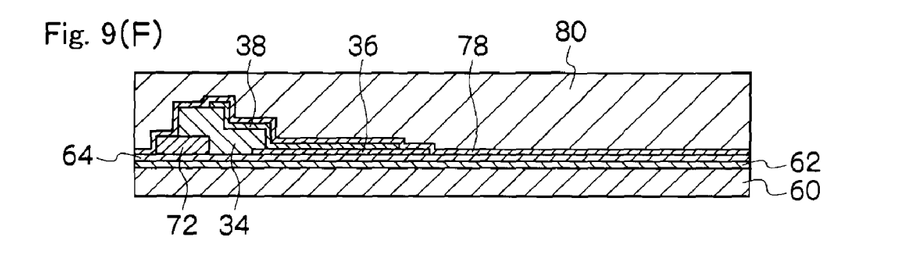

Next, as shown in FIG. 9(F), a photoresist layer 80 may be formed on the upper surface of the conductive metal material 78 by application.

Figure 10A:
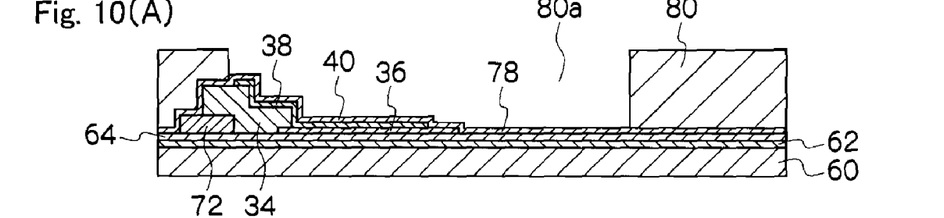
FIG. 10 explains the steps following FIG. 9.

Next, the photoresist layer 80 may be exposed under the state where a part of it is masked and is developed. By such a photolithographic technique, as shown in FIG. 10(A), a recess 80a formed in a flat surface shape taking the form of the aforementioned pedestal main portion 28a is formed in the photoresist layer 80, and a part of the conductive metal material 78 may be exposed in the recess 80a.

Figure 10B:
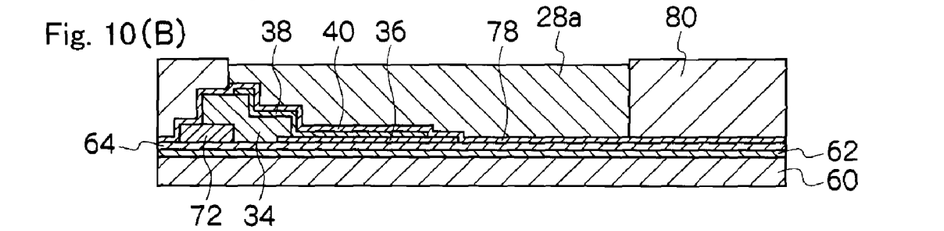

Next, as shown in FIG. 10(B), the aforementioned highly-resilient conductive metal material may be deposited at least in the recess 80a by a deposition technique such as electroplating, sputtering, deposition, or the like, preferably by electroplating. In this manner, the pedestal main portion 28a coupled integrally with the conductive metal material 78 may be formed in the recess 80a.

Figure 10C:
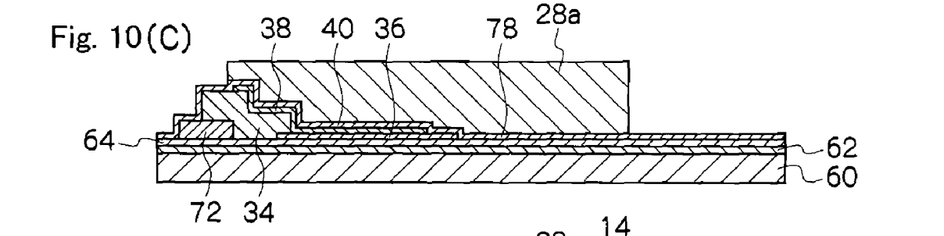

Next, as shown in FIG. 10(C), the photoresist layer 80 may be removed.

Figure 10D:
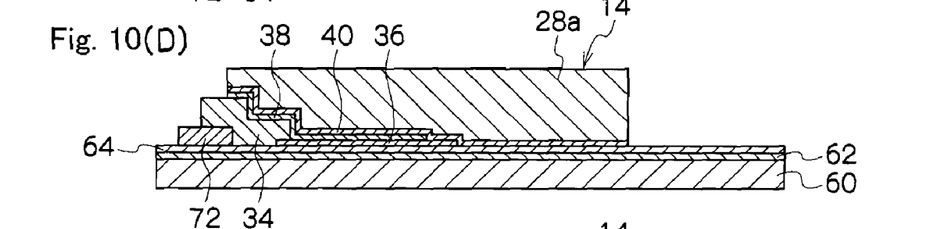

Next, as shown in FIG. 10(D), the conductive metal material 78 may undergo etching processing such as ion beam etching, wet etching, or the like, and a part of the conductive metal material 78 except a part covered with the pedestal main portion 28a is removed. As a result, the conductive metal layer 40 coupled integrally with the resistor 36 and the electrical insulating layer 38 may be formed, and also the contactor 14 is completed.

Figure 10E:
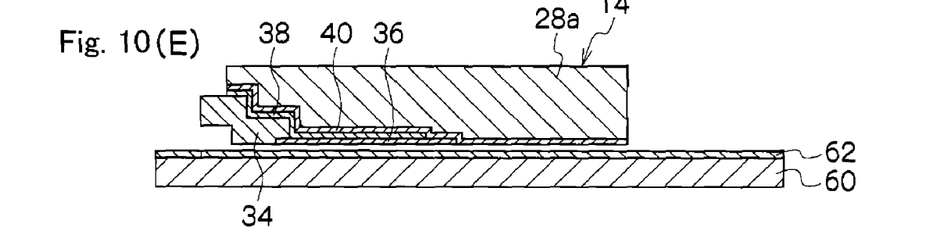

Next, the copper layer 64 and the sacrificial layer 72 are removed by wet etching processing, and the completed contactor 14 may be detached from the substrate 60 and the nickel layer 62 as shown in FIG. 10(E).

Although the resistor 36 is arranged at the pedestal portion 28 so as to electrically connect the pedestal portion 28 to the connection portion 30 by the resistor 36 in the above embodiment, the resistor may be arranged at another part. For example, the resistor may be arranged in the attachment portion 24, in the arm portion 26, or in the pedestal portion 28, or may be arranged to lie over the attachment portion 24 and the arm portion 26 or over the arm portion 26 and the pedestal portion 28.

Naturally, in order to satisfy local and specific requirements, a person skilled in the art may apply to the solution described above many modifications and alterations. Particularly, although the present invention has been described with a certain degree of particularity with reference to described embodiment(s) thereof, it should be understood that various omissions, substitutions and changes in the form and details as well as other embodiments are possible. Moreover, it is expressly intended that specific elements and/or method steps described in connection with any disclosed embodiment of the invention may be incorporated in any other embodiment as a general matter of design choice.

The invention claimed is:

1. An electrical test contactor comprising:
   a contactor main body including a plate-shaped attachment portion extending in the up-down direction, a plate-shaped arm portion extending from the lower end portion of said attachment portion at least to one side in the right-left direction, and a plate-shaped pedestal portion projecting downward from a tip end portion of said arm portion;
   a contact portion projecting downward from the lower end of said pedestal portion and having the lower end of said contact portion acting as a probe tip; and
   a resistor having a higher resistance value than said contactor main body and said contact portion and arranged at said contactor main body so as to heighten the resistance value of said contactor;
   wherein said contact portion and a part of said contactor main body are made of a same metal, and said metal comprises a first portion located at said pedestal portion and acting as a part of said pedestal portion and a second portion projecting downward from the lower end of said pedestal portion and acting as said contact portion.

2. The contactor according to claim 1, wherein said resistor is arranged at said contactor main body and electrically connects said contactor main body to said contact portion.

3. The contactor according to claim 2, wherein said resistor is arranged at least at said pedestal portion and electrically connects said pedestal portion to said contact portion.

4. The contactor according to claim 3, wherein said resistor is arranged at least on one surface in the thickness direction of said main body.

5. The contactor according to claim 4, wherein said first portion is electrically connected at its part to another part of said pedestal portion except at least said first portion.

6. The contactor according to claim 4, wherein said contactor main body, except at least said first portion, is made of a first metal material having higher resiliency than said metal, and said metal is made of a second metal material having higher hardness than said first metal material.

7. The contactor according to claim 4, wherein at least said first portion is exposed at its part to one side surface of said pedestal portion in the thickness direction.

8. The contactor according to claim 1, wherein said resistor is formed by at least one selected from a group comprising an electroplating technique, a sputtering technique, and a deposition technique.

9. The contactor according to claim 4, further comprising an electrical insulating layer arranged at least between said pedestal portion and said resistor so as to allow a part of said resistor to be electrically connected at least to the remaining portion of said pedestal portion except said first portion of said metal.

* * * * *